(12) United States Patent
Lin et al.

(10) Patent No.: US 6,673,698 B1
(45) Date of Patent: Jan. 6, 2004

(54) THIN FILM SEMICONDUCTOR PACKAGE UTILIZING A GLASS SUBSTRATE WITH COMPOSITE POLYMER/METAL INTERCONNECT LAYERS

(75) Inventors: Mou-Shiung Lin, Hsinchu (TW); Jin-Yuan Lee, Hsin-Chu (TW); Ching-Cheng Huang, Hsin-Chu (TW)

(73) Assignee: Megic Corporation, Hsin-Chu (TW)

( * ) Notice: Subject to any disclaimer, the term of this patent is extended or adjusted under 35 U.S.C. 154(b) by 0 days.

(21) Appl. No.: 10/054,001

(22) Filed: Jan. 19, 2002

(51) Int. Cl.[7] .............................................. H01L 21/46
(52) U.S. Cl. ........................ 438/459; 438/613; 438/622; 438/623; 438/780
(58) Field of Search .............................. 438/22, 26, 48, 438/54, 55, 57, 64, 100, 101, 106, 107, 455, 460, 597, 584, 618, 622, 758, 33, 68, 108, 110, 113, 114, 458, 459, 462, 464, 612, 613, 614, 623, 778, 780; 29/729, 738, 739, 740, 762; 228/179.1, 180.21, 180.22; 257/787, 788, 700, 701, 702, 703, 723, 758, 724, 759, 778, 779, 792

(56) References Cited

U.S. PATENT DOCUMENTS

| | | | | |
|---|---|---|---|---|
| 5,081,563 A | * | 1/1992 | Feng et al. ................. | 361/795 |
| 5,111,278 A | * | 5/1992 | Eichelberger ................ | 257/698 |
| 5,250,843 A | * | 10/1993 | Eichelberger ................ | 257/692 |
| 5,291,066 A | * | 3/1994 | Neugebauer et al. ........ | 257/750 |
| 5,331,204 A | * | 7/1994 | Kuroda et al. .............. | 257/758 |
| 5,353,195 A | * | 10/1994 | Fillion et al. ................ | 361/760 |
| 5,353,498 A | * | 10/1994 | Fillion et al. .................. | 29/840 |
| 5,359,496 A | * | 10/1994 | Kornrumpf et al. ........ | 361/795 |
| 5,757,072 A | * | 5/1998 | Gorowitz et al. ........... | 257/700 |
| 6,010,956 A | * | 1/2000 | Takiguchi et al. .......... | 438/623 |
| 6,110,806 A | * | 8/2000 | Pogge ......................... | 438/458 |
| 2002/0020898 A1 | * | 2/2002 | Vu et al. ..................... | 257/676 |

OTHER PUBLICATIONS

Microelectronic Packaging Handbook, Chapter 9, R.R. Tummala et al., Van Nostrand Reinhold, NY, 1989, pp. 673–725.
Novel Microelectronic Packaging Method for Reduced Thermomechanical Stresses on Low Dielectric Constant Materials, R.M. Emery, et al., Intel Corp., Chandler, AZ.

* cited by examiner

Primary Examiner—Alonzo Chambliss
(74) Attorney, Agent, or Firm—George O. Saile; Stephen B. Ackerman; Douglas R. Schnabel

(57) ABSTRACT

A thin film semiconductor die circuit package is provided utilizing low dielectric constant (k) polymer material for the insulating layers of the metal interconnect structure. Five embodiments include utilizing glass, glass-metal composite, and glass/glass sandwiched substrates. The substrates form the base for mounting semiconductor dies and fabricating the thin film interconnect structure.

15 Claims, 22 Drawing Sheets

THIN FILM SEMICONDUCTOR PACKAGE UTILIZING A GLASS SUBSTRATE WITH COMPOSITE POLYMER/METAL INTERCONNECT LAYERS

BACKGROUND OF INVENTION (1) Technical Field

This invention relates in general to the interconnection and packaging of semiconductor dies and discrete components.

(2) Description of Prior Art

The following publications relate to the use of thin films in the interconnection and packaging of semiconductor dies.

Microelectronic Packaging Handbook Chapter 9. R. R. Tummala, E. J. Rymaszewski. Van Nostrand Reinhold 1989.

Novel Microelectronic Packaging Method For Reduced Thermomechanical Stresses on Low Dielectric Constant Materials R. M. Emery, S. Towle, H. Braunisch, C. Hu, G. Raiser, G. J. Vandentop. Intel Corp. Chandler, Ariz.

The requirements for packaging of semiconductor circuit devices are that the package provides physical protection, thermal control, powering capability, and desirable electrical properties of the interconnections. Semiconductor packages also provide the physical translation of interconnecting wiring structures from the fine wiring and wire spacing, and small area, of the semiconductor chip to the bigger interconnection spacing and larger area of the next level of assembly. This capability is usually referred to as "fan-out". In addition the packages need to provide the ability to integrate passive components, such as capacitors, inductors, resistors, waveguides, filters, MEMS (MicroElectroMechanical) devices, and the like, into the wiring structure.

These demands have been and are currently met by numerous package designs. In general these designs tend to degrade the signals that communicate between devices. Usually this degradation is due to the high dielectric constant materials and high resistance metal used as insulators in the interconnection design. The materials used as insulators; silicon oxides, glass, glass ceramics, or ceramics are chosen for their mechanical properties and the method of fabrication. An important mechanical property is the material's thermal coefficient of expansion, or TCE. The TCE in many package designs needs to match that of the silicon semiconductor die in order to have low mechanical stresses in the package structure.

Materials with low TCE also have high dielectric constants (k). The high dielectric constants result in unwanted electrical properties of the interconnections; i.e., high impedances. Examples of such designs are semiconductor packages that utilize ceramic substrates to mount and interconnect the semiconductor circuits.

In order to take advantage of the high switching speeds of today's digital circuits the interconnection technology both on and off the semiconductor chips or dies requires novel approaches utilizing low dielectric constant (k) materials such as polyimide or BCB (benzocyclobutene) to provide the necessary electrical parameters of the interconnects that do not degrade circuit performance.

The use of low dielectric materials used as insulating layers for interconnects also requires novel mechanical design approaches to minimize the deleterious effects of TCE mismatches.

SUMMARY OF THE INVENTION

The objective of the present invention is to provide a semiconductor interconnecting package design and method of fabrication utilizing polymer thin film techniques.

It is a farther objective of the invention that the semiconductor package provide the interconnect density required by the semiconductor design.

It is also the objective of the present invention to provide a semiconductor package that allows for input and output interconnections on a pitch compatible both with the semiconductor and the next level of package.

The capability to place discrete components close to the semiconductor circuit's input and output connections is an additional objective of the present invention.

In addition an objective of the present invention is to utilize current fabrication techniques and existing fabrication infrastructure.

The above objectives are achieved by the present invention by utilizing a glass or glass-metal composite substrate as the basic structure of the package. Semiconductor dies are bonded to the substrates and a thin film structure is fabricated utilizing metal and polymer films to interconnect the semiconductor dies. The glass or glass-metal composite substrate provides the necessary mechanical protection and support to the semiconductor dies. It also provides the planarity necessary for the fabrication of the interconnect polymer layers that interconnect the semiconductors.

DETAILED DESCRIPTION OF THE PREFERRED EMBODIMENT

Figure 1A:
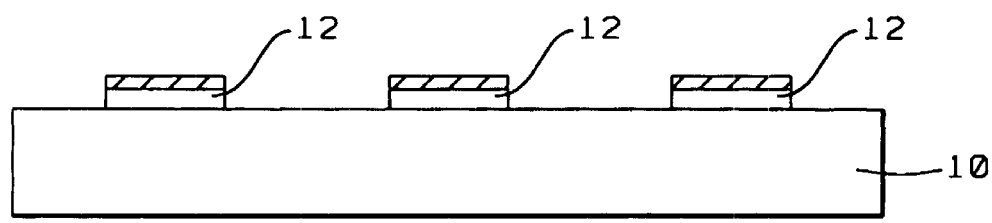
FIGS. 1a–1j show a first embodiment of the invention and the major fabrication steps.
Figure 1B:
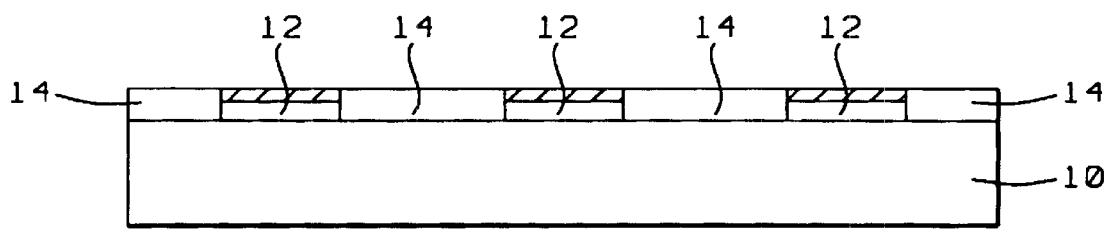
Figure 1C:
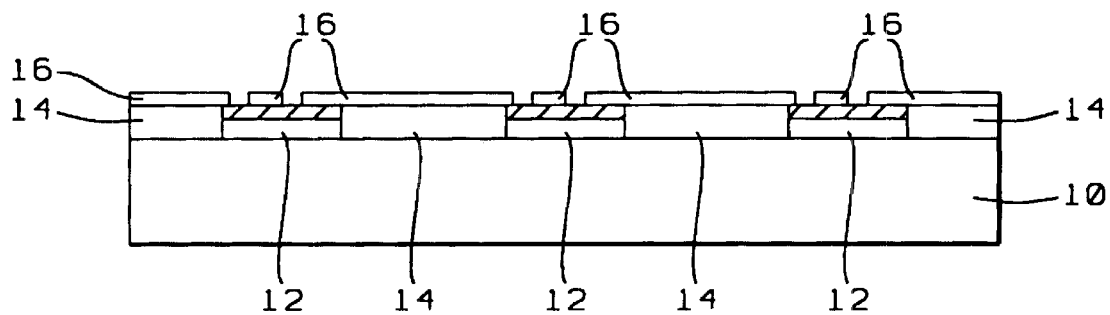
Figure 1D:
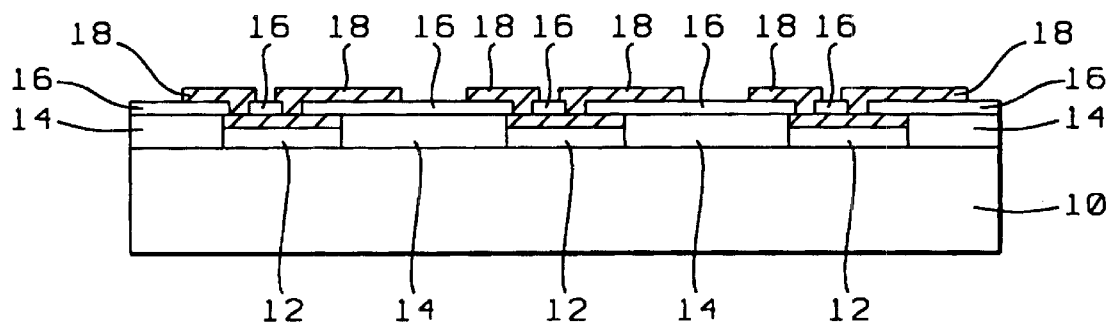
Figure 1E:
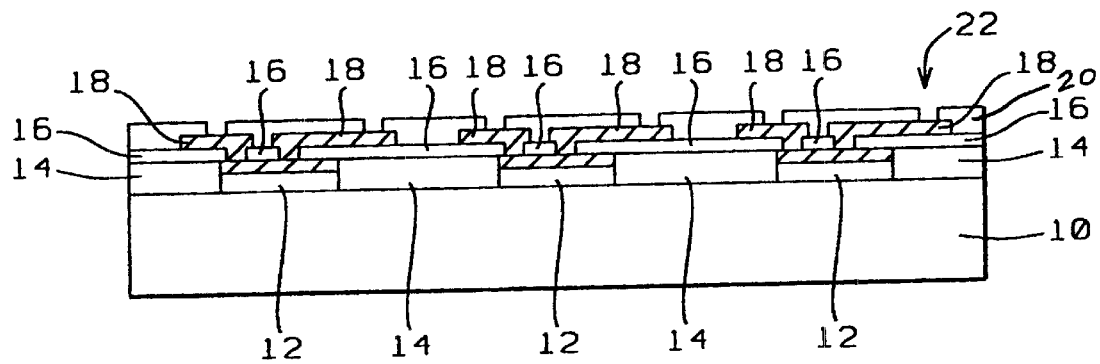
Figure 1F:
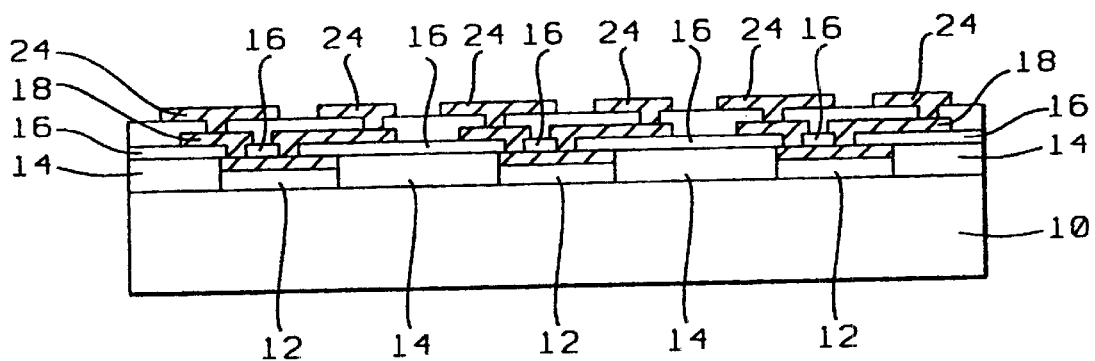
Figure 1G:
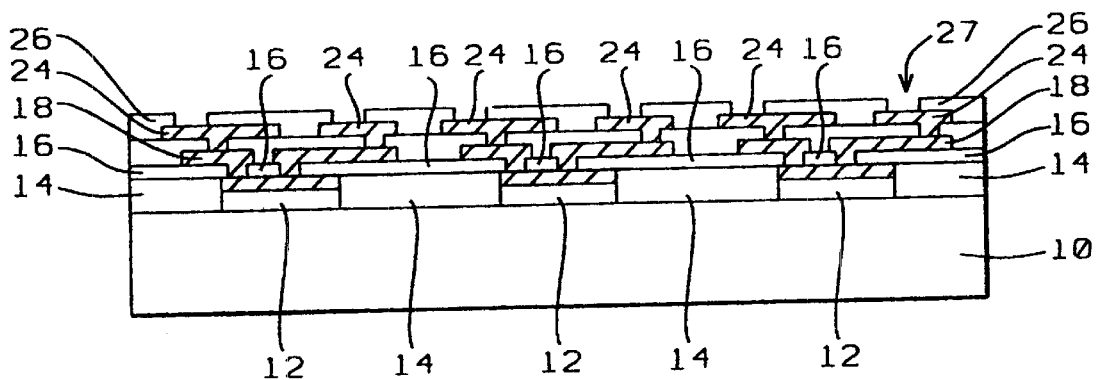
Figure 1H:
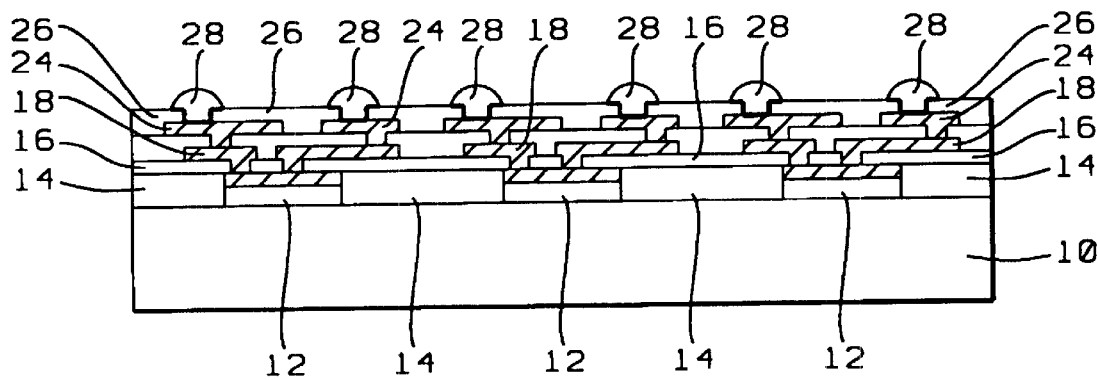

Semiconductor packages provide mechanical protection to the semiconductor dies as well as providing the ability to interconnect the circuits and the circuits to the next level of package. The semiconductor packages also provide the necessary interconnection paths between semiconductor dies when used in multi-chip designs.

One approach to providing interconnection capabilities and connectivity to the next level package, is described in U.S. patent application Ser. No. 09/251,183, filed on Feb. 17, 1999, and herein incorporated by reference. After typical semiconductor processing is completed, including a top passivation layer and exposed metal pads, this application describes a "post passivation process" using thick layers of organic dielectric films, and thick metal layers for signal paths and power/ground busses. Post passivation technology offers low impedance interconnection, passive components and metal bumps (usually solder) based on a wafer level process. However, the wafer level process limits the capability of fan out of pad location to a larger pitch, and limits the capability to integrate more passive components requiring a large area. The invention relies on a separate substrate for the pad fan out and accomodation of more and bigger passive components.

The interconnect technology used needs the ability to provide the necessary fine pitch as required by the semiconductor circuits. Also, the interconnect technology has to provide low impedance interconnects utilizing low dielectric constant (k) insulating layers. The present invention discloses five different embodiments for the thin film semiconductor package structure.

The first embodiment of the present invention as shown in FIGS. 1a–1j utilizes a glass substrate 10. Semiconductor dies 12 are attached by conventional means; i.e., die bonding to the glass substrates face up, at the desired locations. A polymer 14 is optionally used to fill the gaps between the dies and provide a planar surface. This material may also be epoxy, deposited by spin-on, dispense, or screen printing. The first layer of dielectric 16, a polymer such as polyimide, BCB, elastomer and the like, is deposited by spin coating to a thickness of between about 5 and 100 um. If the polymer or epoxy 14 is not used to fill the gaps between dies, the dielectric 16 is used to fill the gaps. Contact holes to the semiconductor dies are exposed by lithographic and etching techniques to expose the metal contacts on the semiconductor dies. The polymer 16 can be photosensitive material.

The first metal layer 18 is deposited by sputtering or electroplating and is patterned by photolithographic techniques. This layer contains the interconnects or fan-out lines and may contain passive components such as capacitors, inductors, resistors, waveguides, filters, MEMS devices, and the like, that are required by the electrical design. The metal used is preferably copper but may be gold, aluminum or other conducting elements, and is deposited to a thickness of between about 1 and 150 um.

The second layer of dielectric polymer 20 is formed by spin-on coating, screen printing or laminating, to a thickness of between about 1 and 150 um, and patterned by photolithographic techniques. Chemical etching is used to open contact holes 22 to the first layer of metal 18. The polymer 20 can also be photosensitive material.

A second layer of metal 24 is then deposited, to a similar thickness as metal layer 18, by sputtering or electroplating to provide the necessary interconnects or fan-out to the terminals of the package or a third layer of metal if required.

Multiple alternating layers of dielectric and metal (not shown) may be deposited and patterned until the final layer of dielectric 26 is then deposited, on the last layer of metal 24, and holes opened 27 to the contact points of metal layer.

A layer of solder is deposited by electroplating, screen printing or ball mounting and contacts are made through the etched holes in the insulating layer to the final metal layer. The solder is then reflowed to form the solder bumps 28. Alternately, gold bumps, may be used, as is known in the art.

Figure 1I:
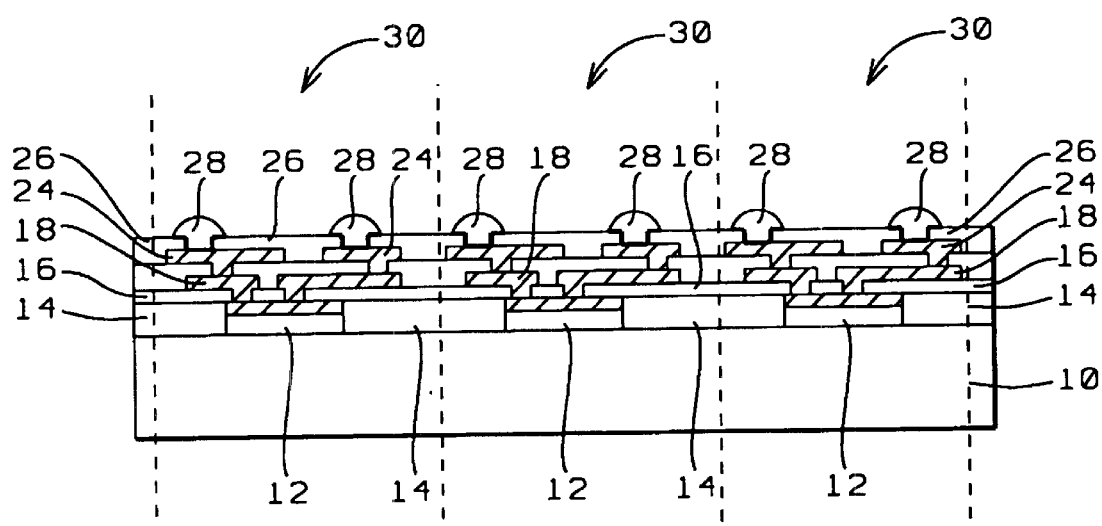
Figure 1J:
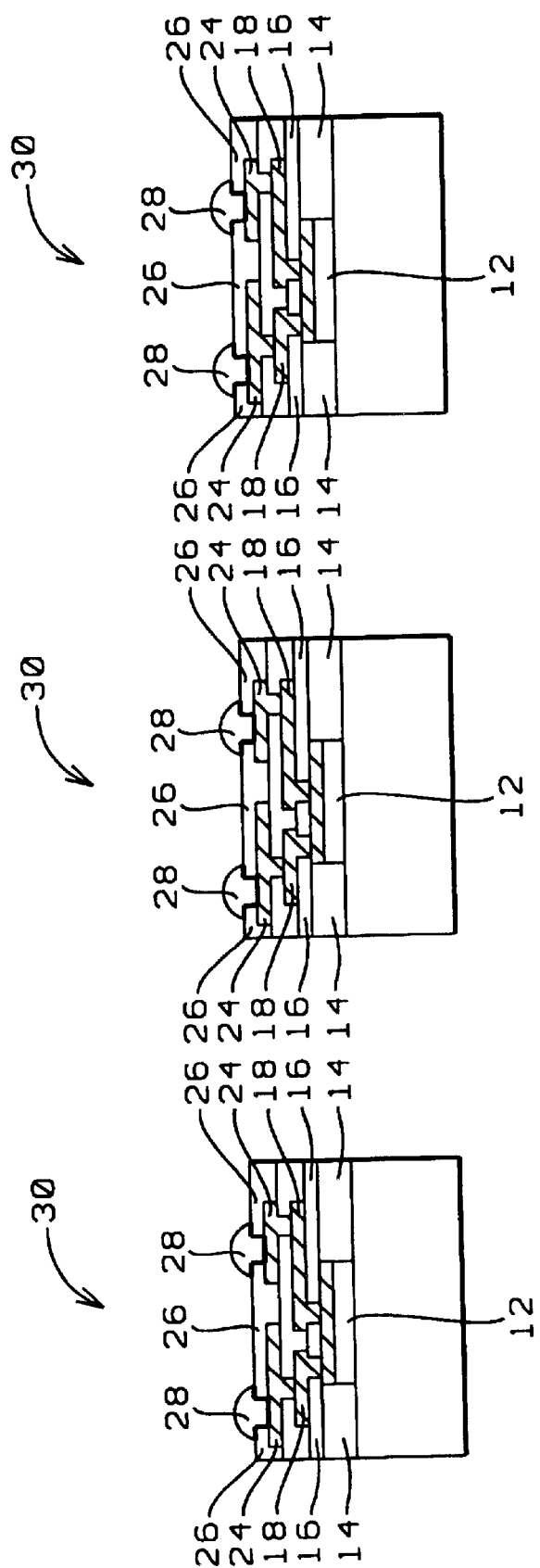
Figure 2A:
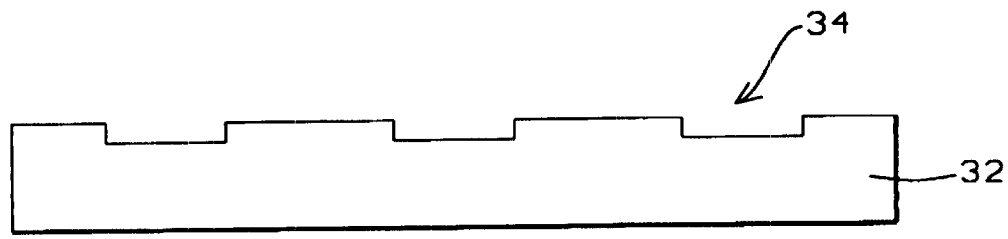
FIGS. 2a–2j show a second embodiment of the invention and the major fabrication steps.
Figure 2B:
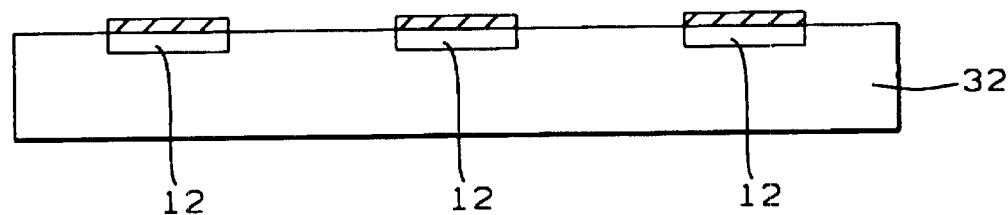
Figure 2C:
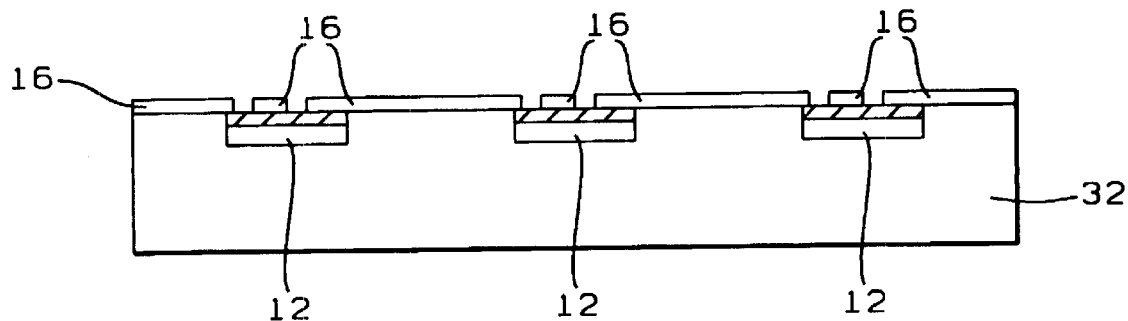
Figure 2D:
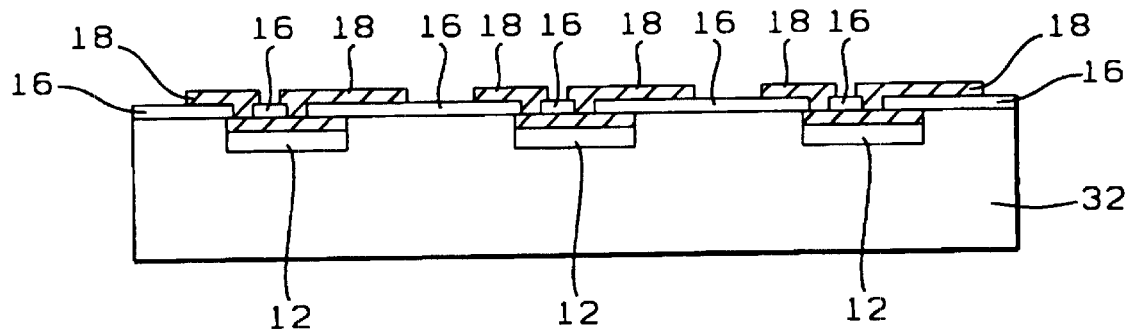
Figure 2E:
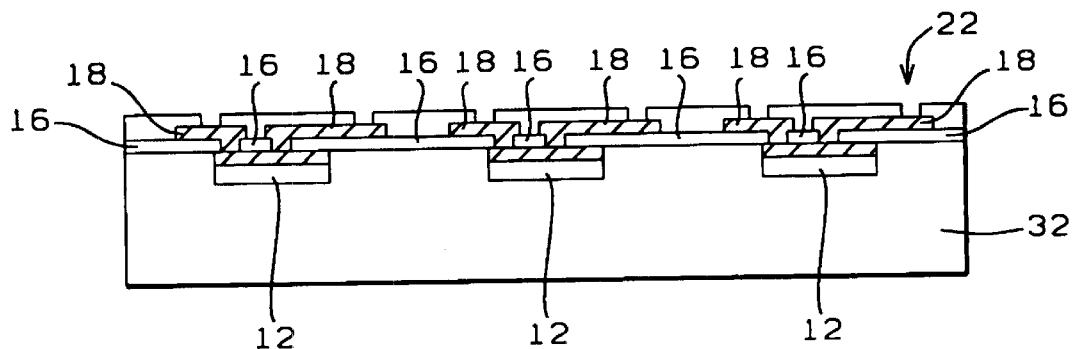
Figure 2F:
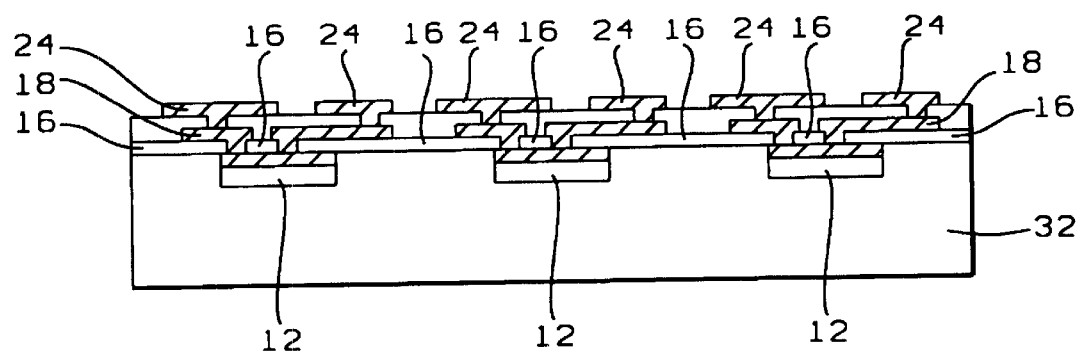
Figure 2G:
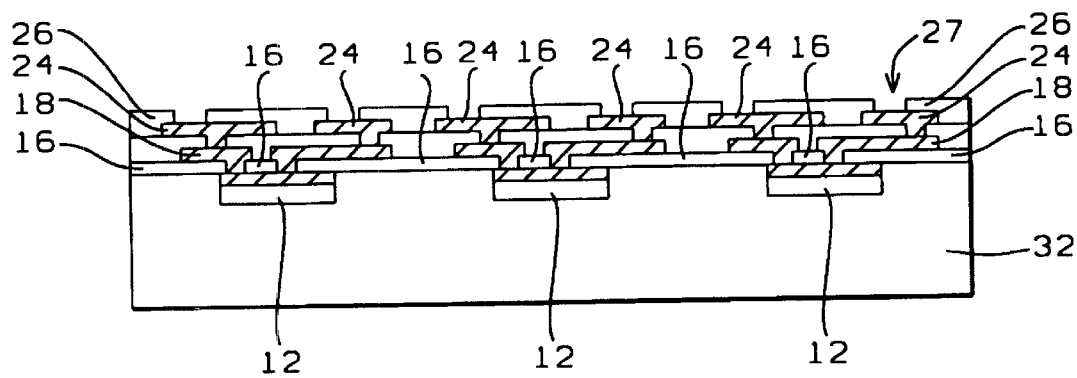
Figure 2H:
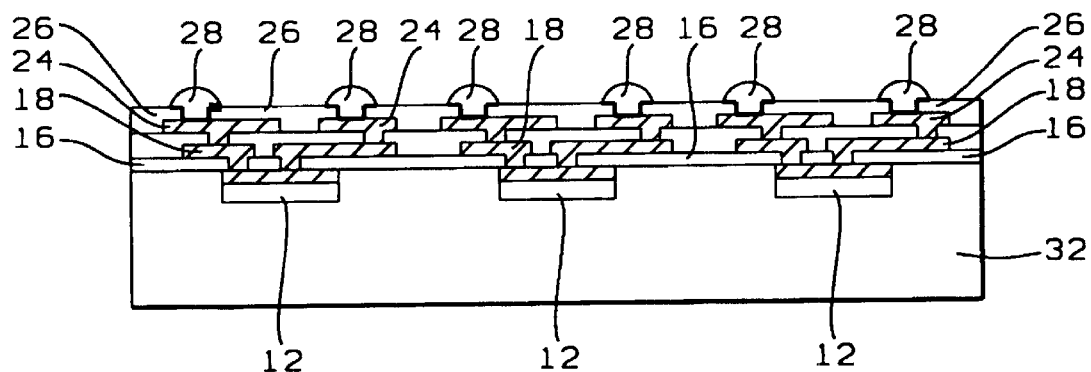
Figure 2I:
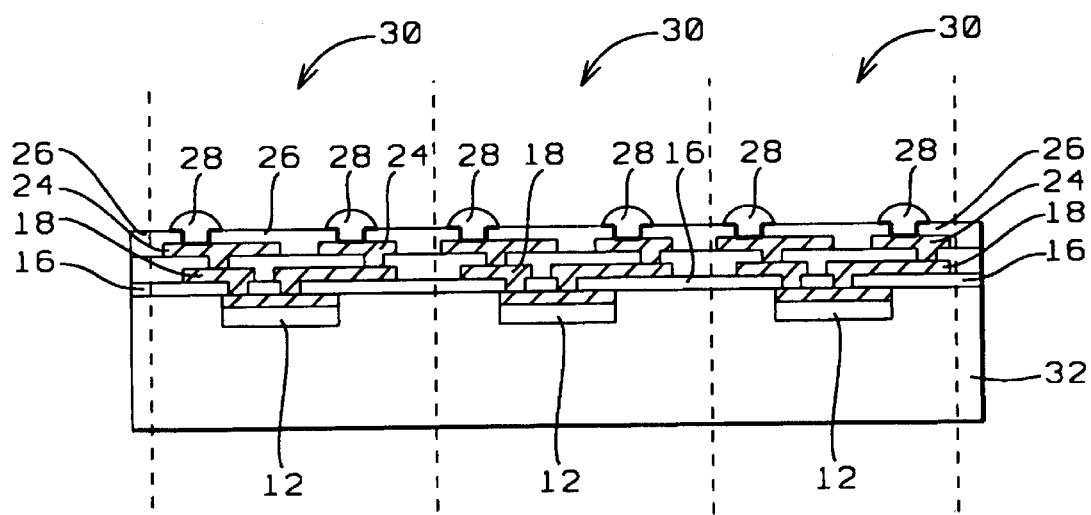
Figure 2J:
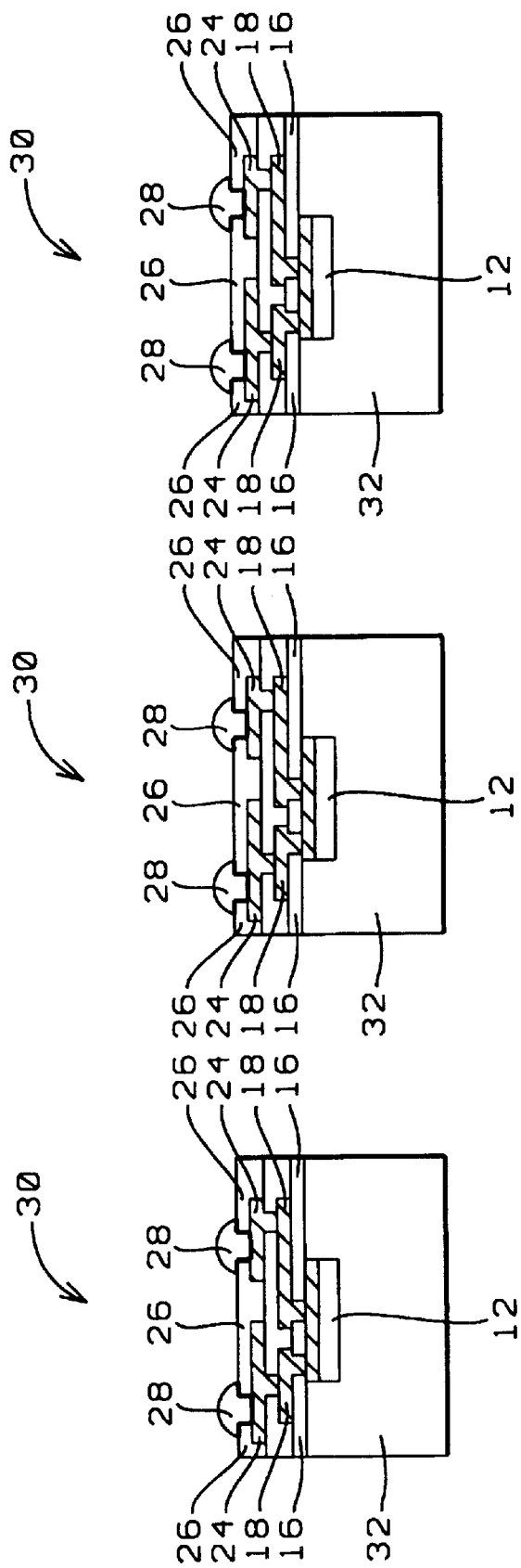
Figure 3A:
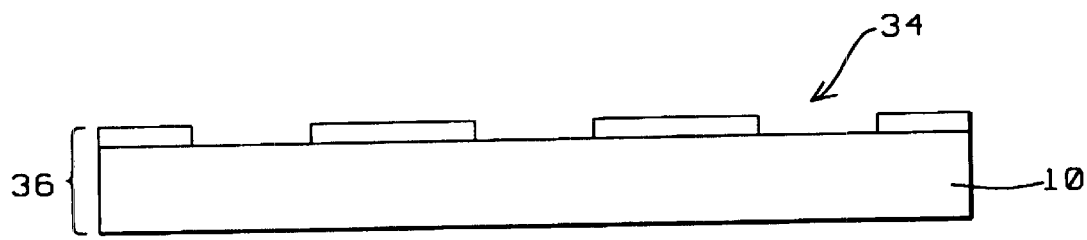
FIGS. 3a–3j show a third embodiment of the invention and the major fabrication steps.
Figure 3B:
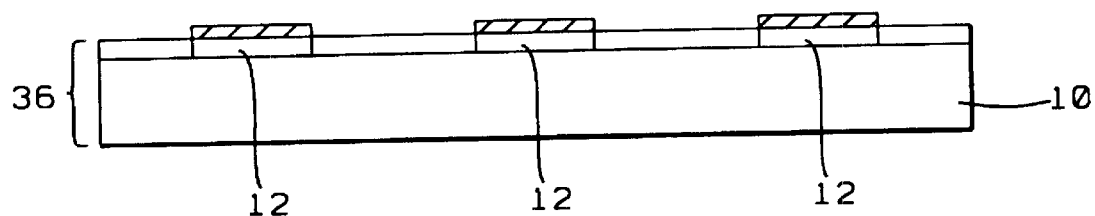
Figure 3C:
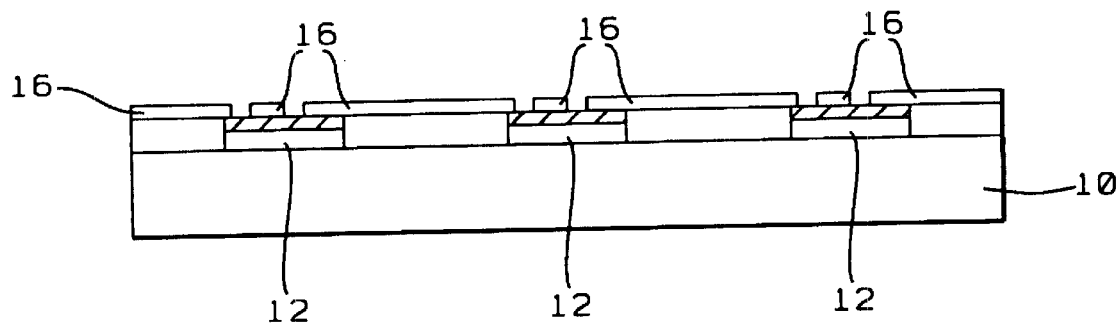
Figure 3D:
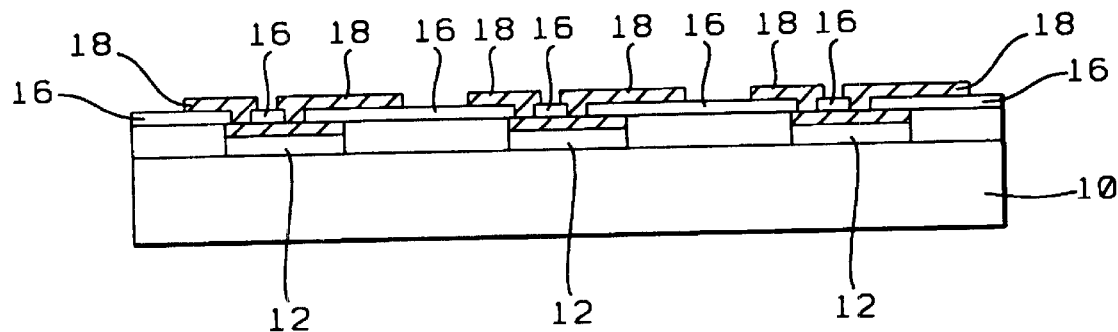
Figure 3E:
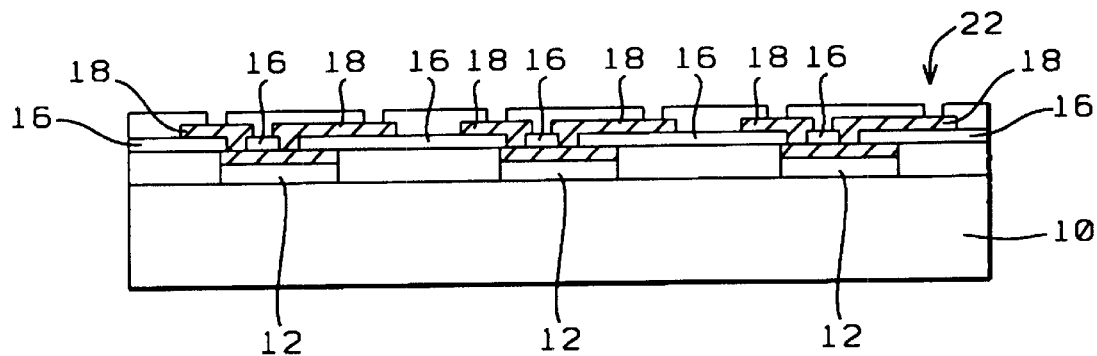
Figure 3F:
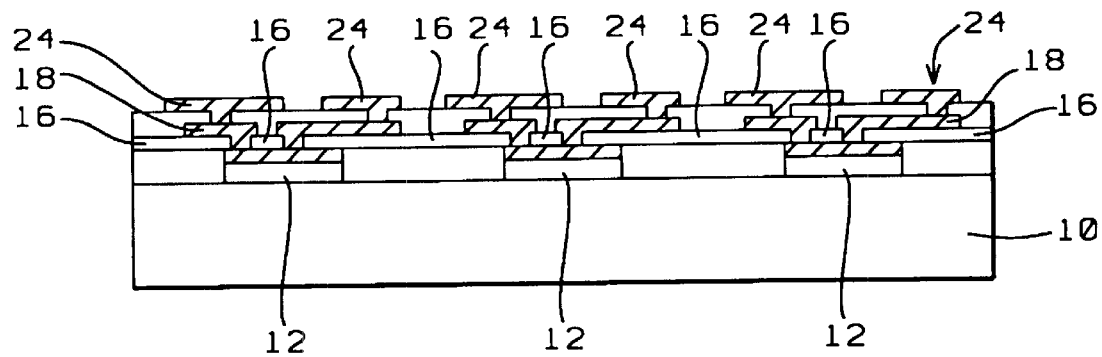
Figure 3G:
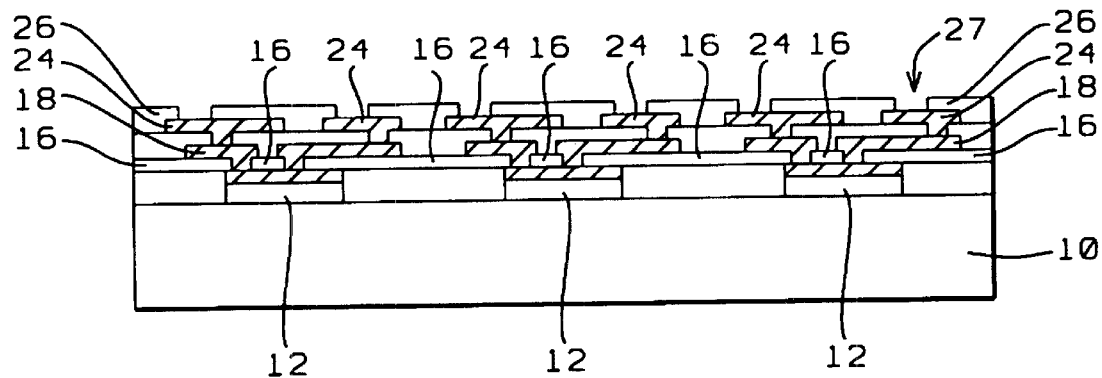
Figure 3H:
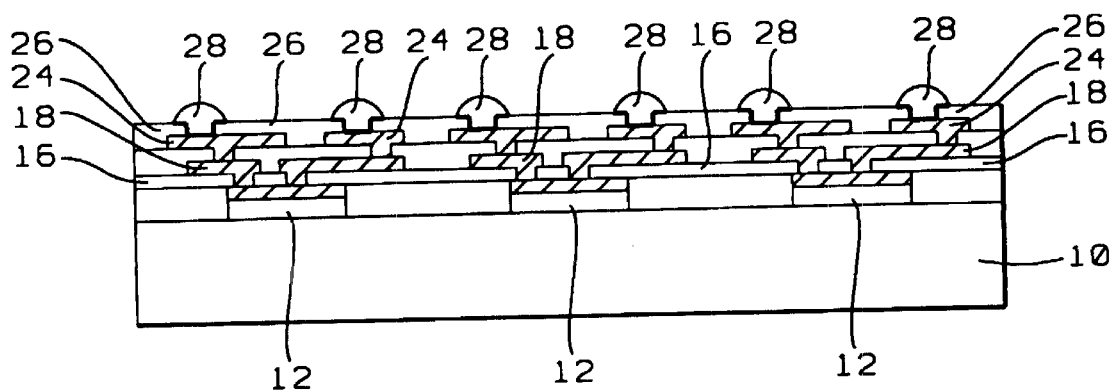
Figure 3I:
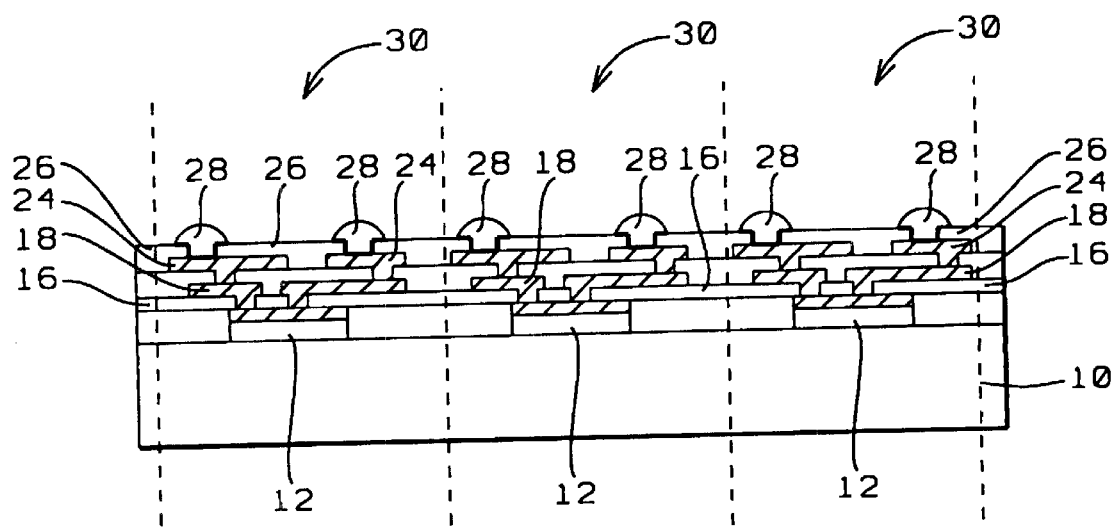
Figure 3J:
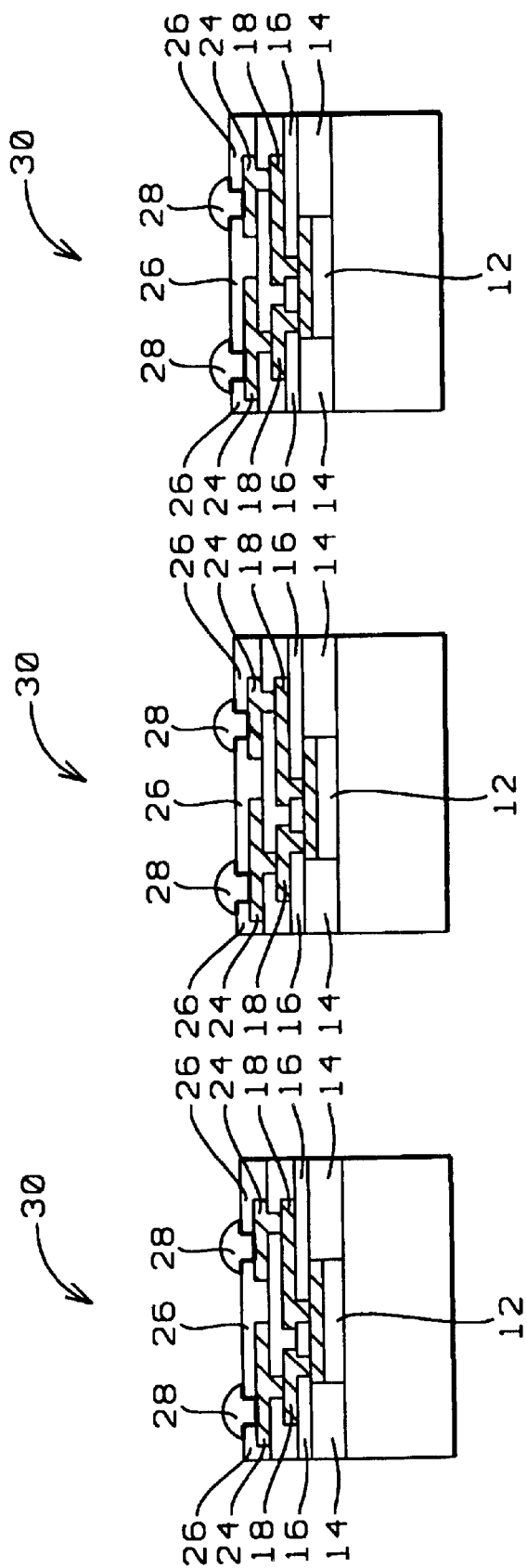
Figure 4A:
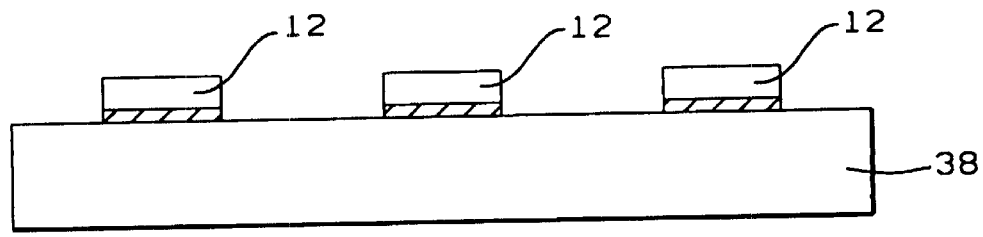
FIGS. 4a–4l show a fourth embodiment of the invention and the major fabrication steps.
Figure 4B:
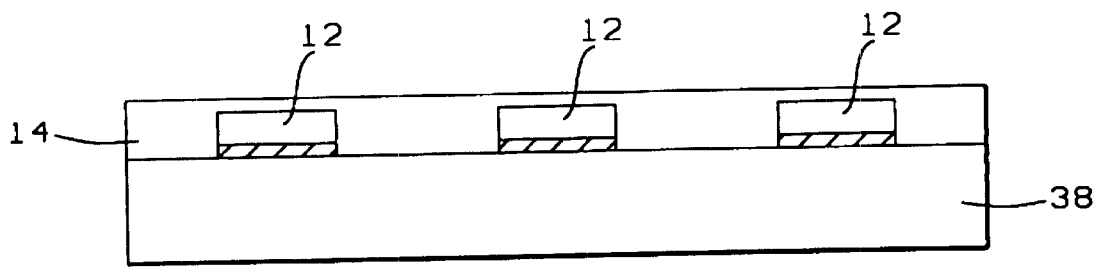
Figure 4C:
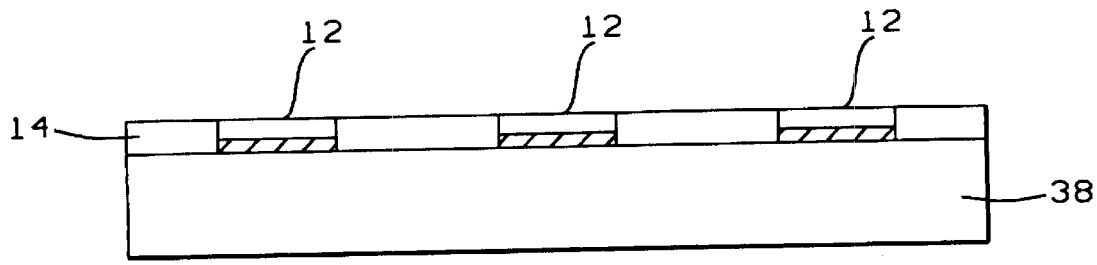
Figure 4D:
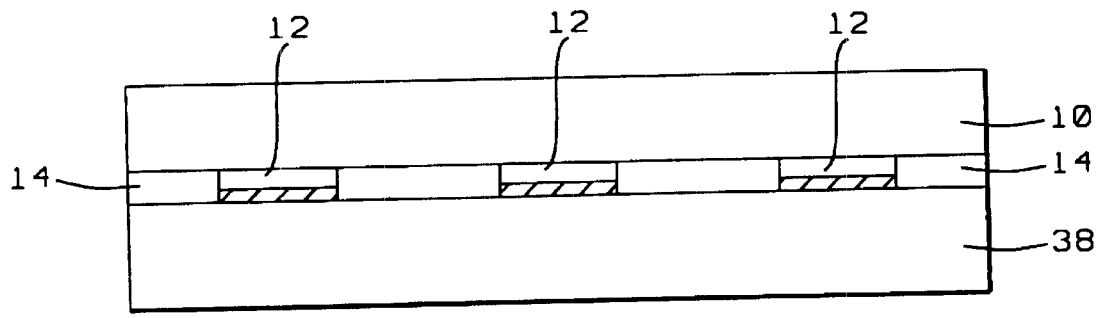
Figure 4E:
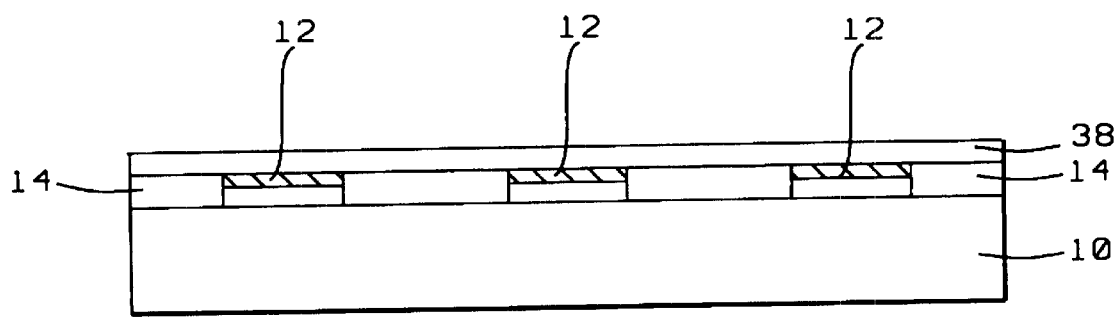
Figure 4F:
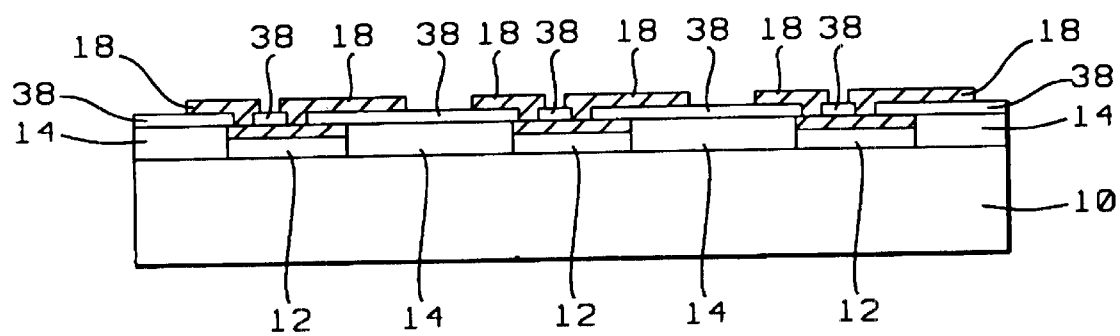
Figure 4G:
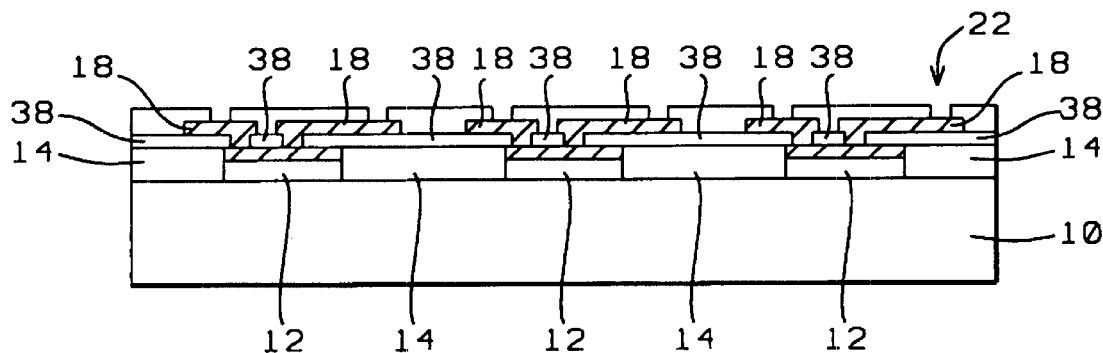
Figure 4H:
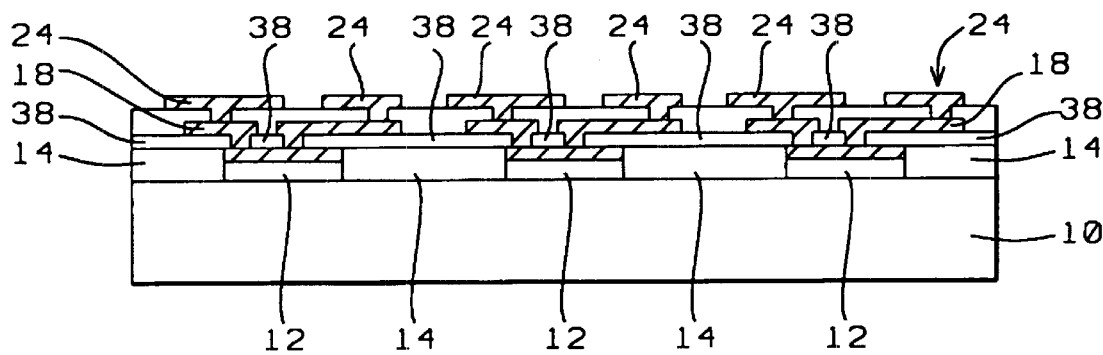
Figure 4I:
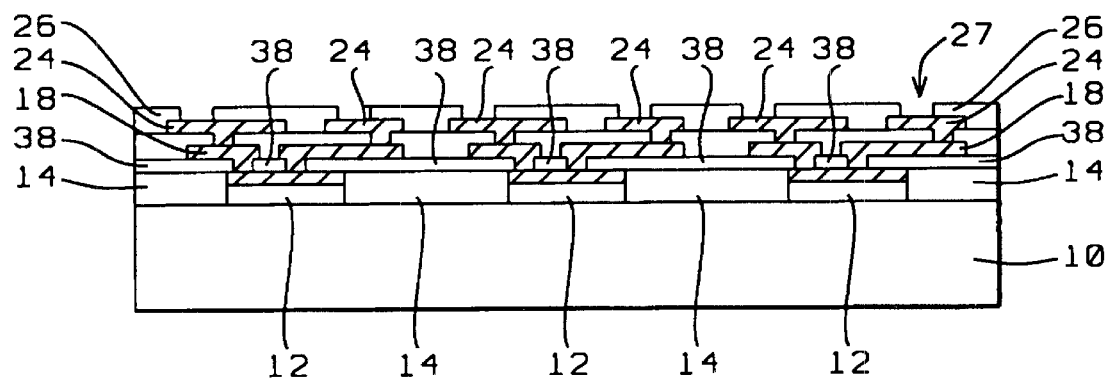
Figure 4J:
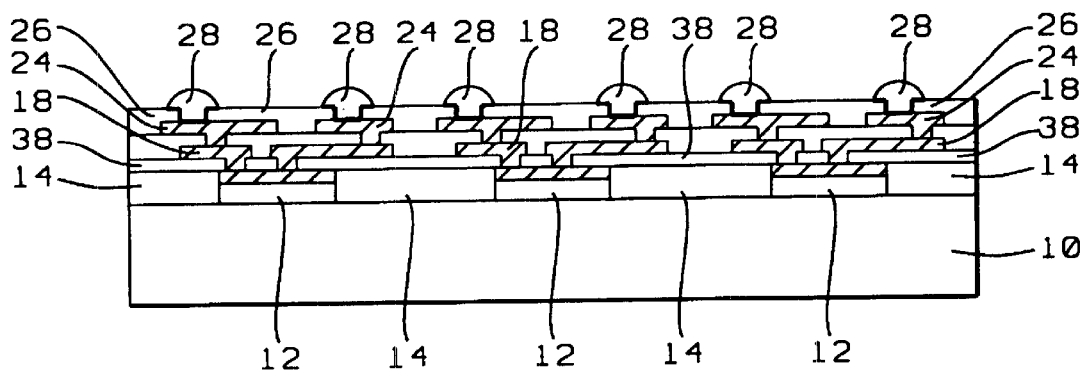
Figure 4K:
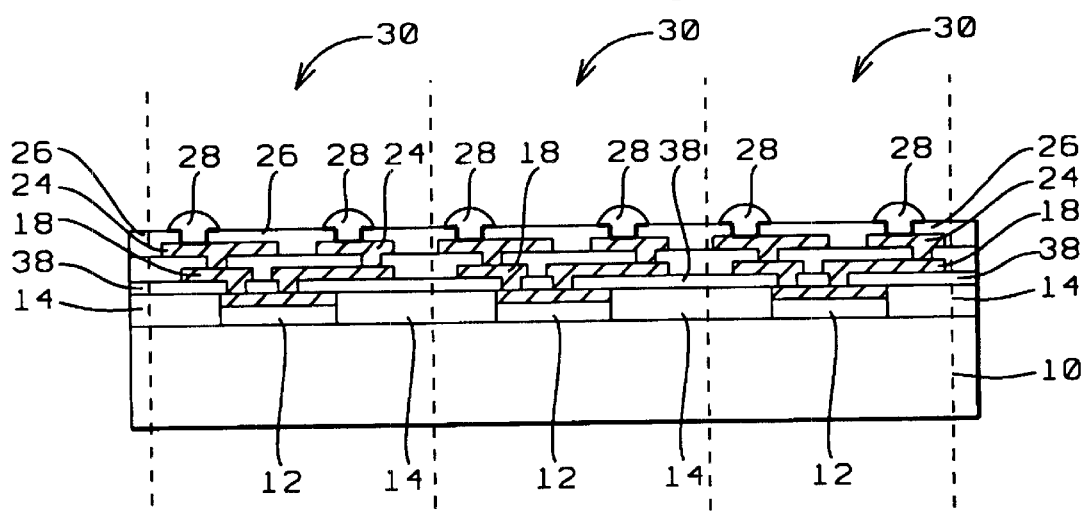
Figure 4L:
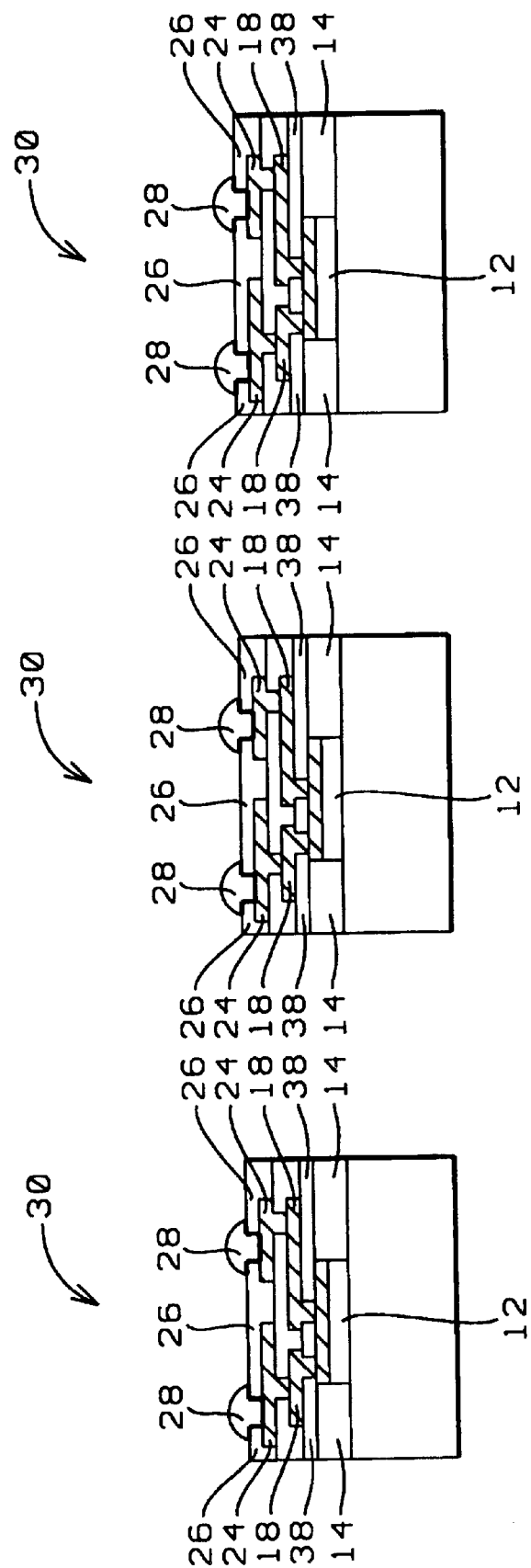
Figure 5A:
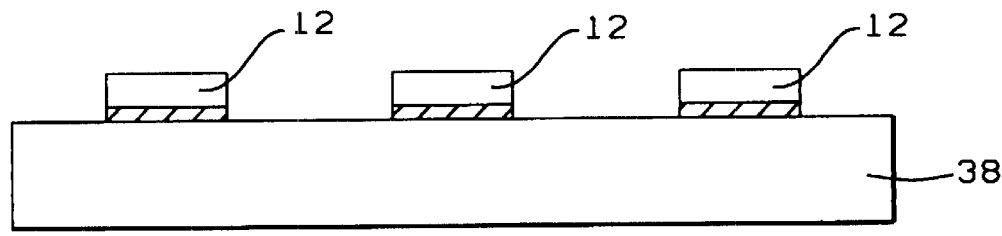
FIGS. 5a–5l show a fifth embodiment of the invention and the major fabrication steps.
Figure 5B:
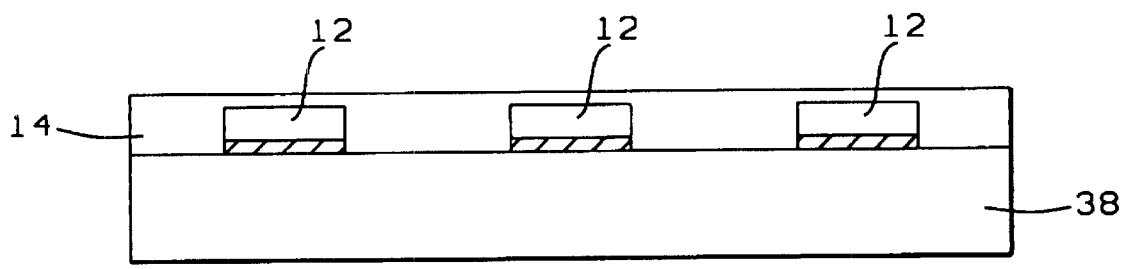
Figure 5C:
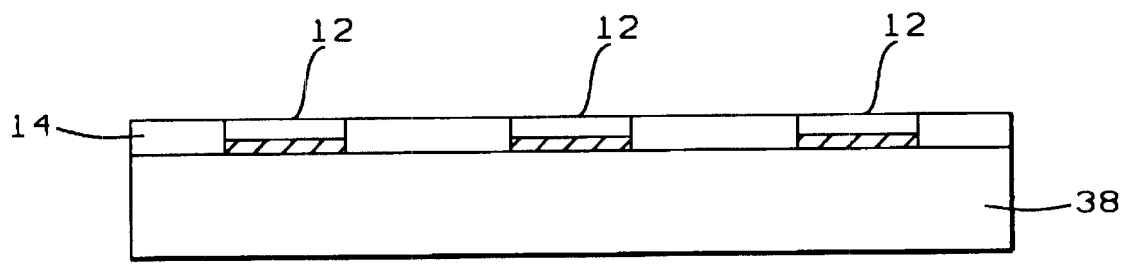
Figure 5D:
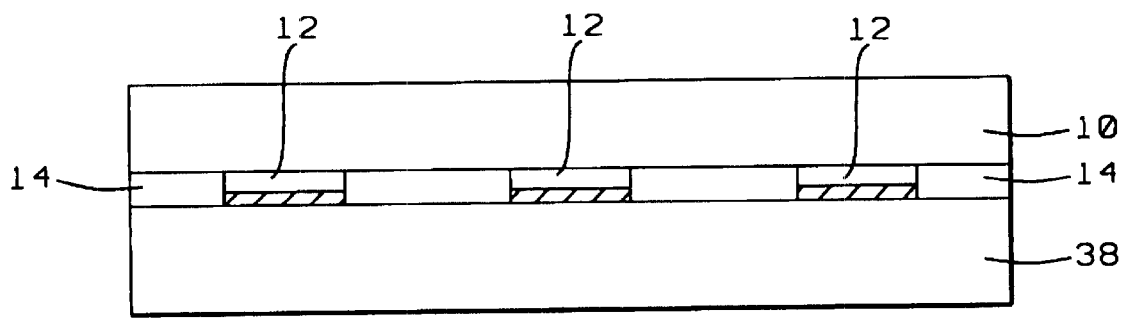
Figure 5E:
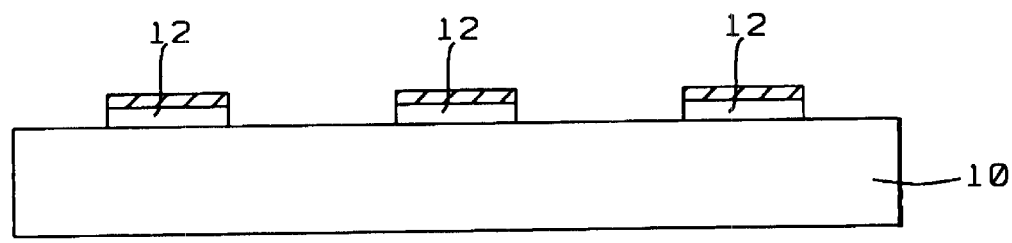
Figure 5F:
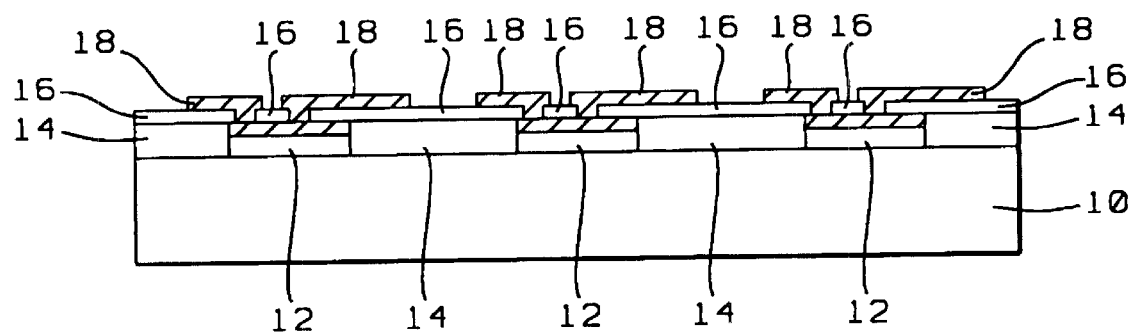
Figure 5G:
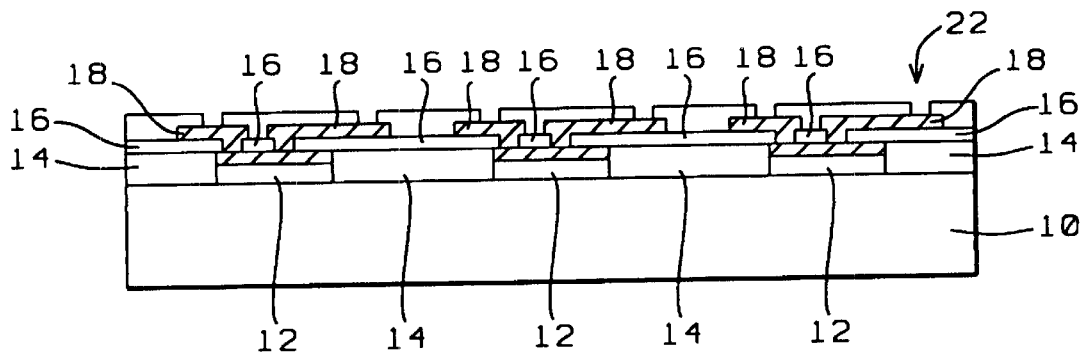
Figure 5H:
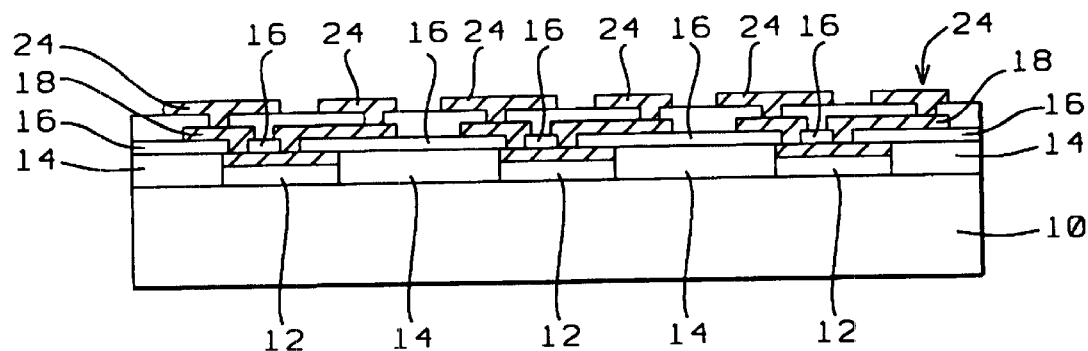
Figure 5I:
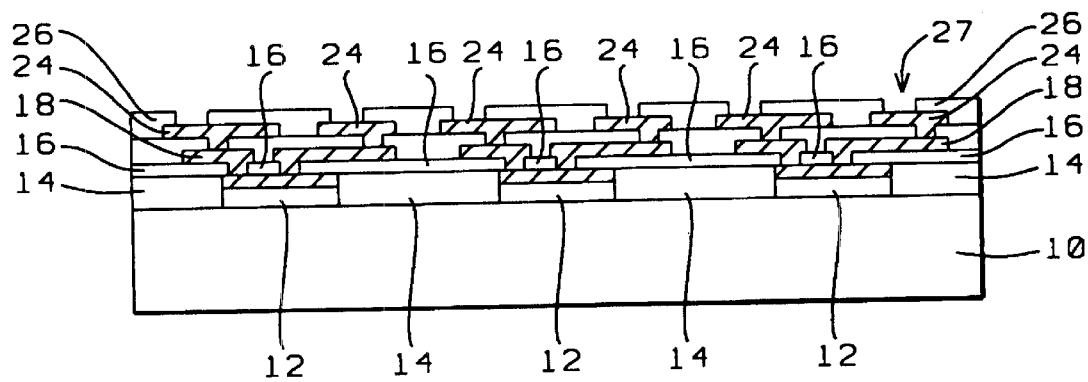
Figure 5J:
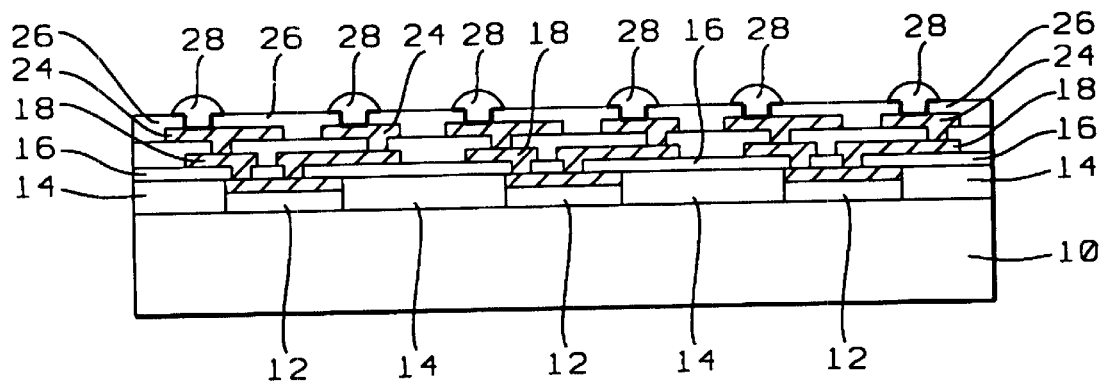
Figure 5K:
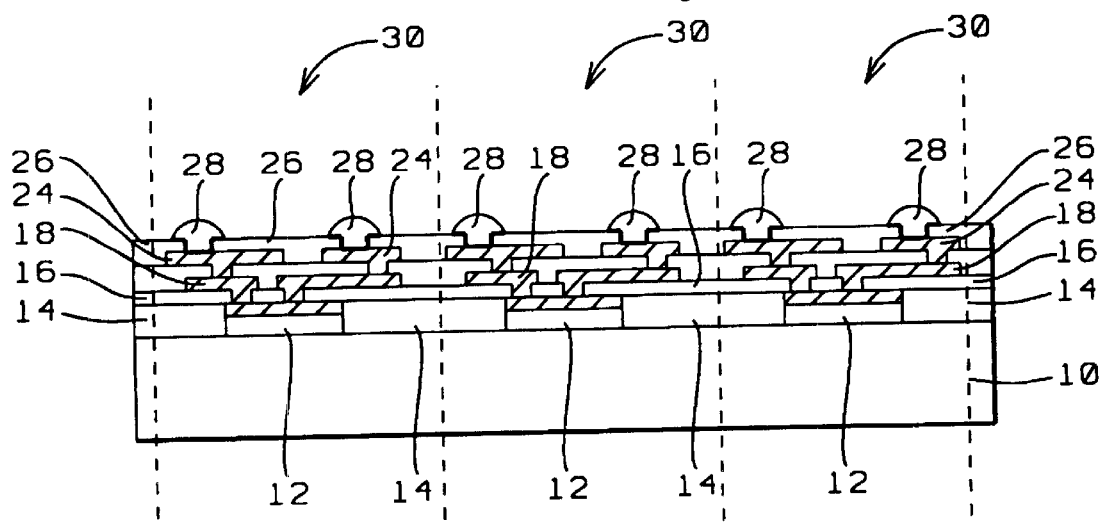
Figure 5L:
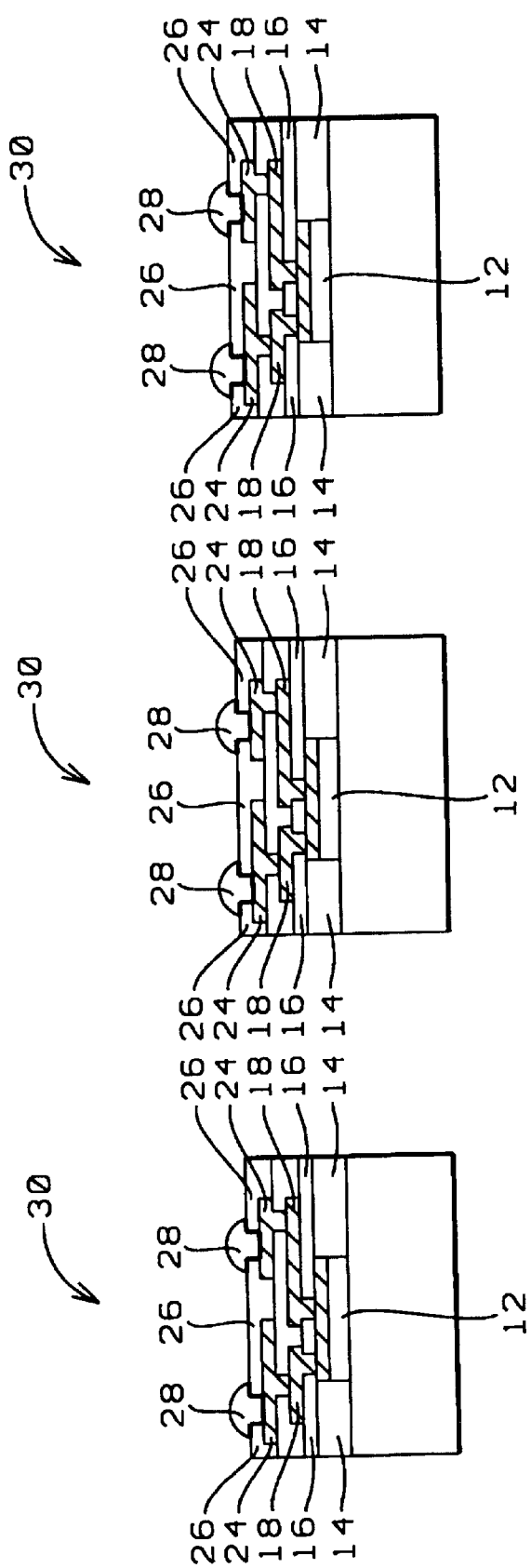

At this stage the panel is segmented. If the product is a single chip package, it is segmented into individual single chip modules 30, as shown in FIGS. 1i and 1j. If the product application is a multi-chip package, it would include interconnections(not shown) between the dies, and segmenting would be performed so that the interconnected dies were not segmented from one another. In the case of multi-chip packages, each chip within the multi-chip package can be the same type (e.g., memory, logic, etc.) or they may be of different types.

The second embodiment of the present invention shown in FIGS. 2a–2j also utilizes thin film polymer material for the insulating layers of the interconnect structure. The major fabrication steps are the same as the first embodiment shown in FIG. 1 with the exception that the glass substrate 32 used has cavities 34 to house the semiconductor dies, and that allow the semiconductor dies 12 to have a common planar surface for the application of the first dielectric layer 16. The cavities are formed by etching to a depth of about the thickness of the die, which is typically between about 30 and 750 um.

The third embodiment of the present invention shown in FIGS. 3a–3j utilizes a glass-metal composite as the substrate 36. The glass layer is etched with cavities, using the underlying metal as an etch stop, that allow the semiconductor dies 12 to be bonded and to have a common planar surface for the application of the first dielectric layer 16. Alternately, holes may be punched in the glass sheet and the sheet laminated to the metal substrate. In addition the thermal path from the chip is improved by bonding to the metal substrate which acts as a thermal spreader. The thin film interconnect structure is the same as in the previous embodiments.

The fourth embodiment of the present invention as shown in FIGS. 4a–4j utilizes a glass substrate with the semiconductor dies mounted with the active surface on the glass substrate 38, or face down. A polymer or epoxy is used to fill the gap between dies and may cover dies also. The polymer or epoxy is used for planarization purposes. The surface is then ground to the desired thickness. CMP (Chemical Mechanical Planarization) may be used in the grinding. The first glass is used for the leveling of the active surface of the semiconductor dies A second glass substrate 10 is then bonded to the back side of the semiconductor dies 12. The first glass substrate 38 is thinned by backside grinding to a thickness of 2 um to 150 um depending on the electrical design of the interconnect. Vias are etched in the thin glass substrate layer 38 to contact the semiconductor dies. The thin film interconnect layers are then formed as in the previous embodiments.

The fifth embodiment of the present invention shown in FIGS. 5a–5j utilizes a glass substrate 38 with the semiconductor dies mounted face down on the surface. A coating of a polymer or epoxy is deposited and the surface including the back of the semiconductor dies is ground to the desired thickness. Leveling of the surface is important for the follow-on thin film process. A second glass substrate is bonded to the back of the thinned semiconductor dies and the first glass substrate is removed. The thin film process is then completed as described above.

In each of the above embodiments, the interconnect metal may be used to form interconnections between one or more points of electrical contact on each of the semiconductor dies.

The present invention as described in the five embodiments provides wiring structures and methods to obtain them, that have the ability of greater fan-out from the semiconductor dies with wiring structures that are far superior to the post passivation process described earlier and/or wafer level packages. The structures described above also have the ability to provide for a variety of passive components, e.g., capacitors, inductors, etc., internal to the wiring structure. These structures may be used in single chip fan-out packages or as interconnections between chips or multi-chip packages. Another advantage of the present invention is the ability to utilize present manufacturing equipment such as used in the manufacture of glass LCD panels.

Although the invention has been described and illustrated with reference to specific illustrative embodiments thereof, it is not intended that the invention be limited to those illustrative embodiments. Those skilled in the art will recognize that variations and modifications can be made without departing from the spirit of the invention. It is therefore intended to include within the invention all such variations and modifications which fall within the scope of the appended claims and equivalents thereof.

What is claimed is:

1. A method of fabricating the thin film semiconductor die package structure comprising:

provide a metal substrate;

forming a glass layer with cavities for mounting semiconductor dies on said metal substrate;

sequentially forming polymer insulating layers and metal interconnect layers;

forming a layer of solder; and reflowing the solder to form solder bumps.

2. A method of fabricating a thin film semiconductor die package structure comprising:

providing a glass substrate with semiconductor dies mounted on the active surface;

filling polymer or epoxy between and over the backside of said semiconductor dies, to obtain a planarized surface;

grinding said backside of said semiconductor dies, to a desired thickness of said semiconductor dies and said polymer or epoxy to obtain a planarized surface;

mounting a second glass substrate on the backside of the semiconductor dies;

grinding the first glass substrate to a desired glass thickness;

etching holes in said first glass substrate to expose said semiconductor dies;

sequentially forming polymer insulating layers and metal interconnect layers over said first glass substrate;

depositing a layer of solder; and reflowing the solder to form solder bumps.

3. The method of claim 2 wherein said desired thickness of said semiconductor dies is between about 2 and 500 um.

4. The method of claim 2 wherein said desired glass thickness is between about 2 and 150 um.

5. The method of claim 2 further comprising dicing said thin film semiconductor die package structure into single chip semiconductor packages.

6. The method of claim 2 further comprising dicing said thin film semiconductor die package structure into multi-chip semiconductor packages.

7. The method of claim 6 wherein said semiconductor dies mounted within said multi-chip semiconductor packages comprise the same type of integrated circuit chips.

8. The method of claim 6 wherein said semiconductor dies mounted within said multi-chip semiconductor packages comprise different types of integrated circuit chips.

9. The method of claim 2 wherein solder bumps are connected to said interconnect metal and incorporated as interconnects to the next level of assembly.

10. The method of claim 2 wherein connector pins are connected to said interconnect metal and for assembly to the next level of packaging.

11. The method of claim 2 wherein said one or more layers of interconnect metal and said one or more insulating layers comprise an interconnect system, and further comprising incorporating one or more devices within said interconnect system.

12. The method of claim 11 wherein said one or more devices are selected from the group comprising inductors, resistors, capacitors, waveguides, filters and MEMS devices.

13. The method of claim 2 further comprising using said one or more layers of interconnect metal for interconnections between one or more points of electrical contact on each of said semiconductor dies.

14. A method of fabricating a thin film semiconductor die package structure comprising:

providing a glass substrate with semiconductor dies mounted on the active surface;

filling polymer or epoxy between and over the backside of said semiconductor dies, grinding said backside of said semiconductor dies, to a desired thickness of said semiconductor dies and said polymer or epoxy to obtain a planarized surface;

mounting a second glass substrate on the backside of the semiconductor dies;

removing said first glass substrate;

sequentially forming polymer insulating layers and metal interconnect layers over said semiconductor dies;

depositing a layer of solder; and reflowing the solder to form solder bumps.

15. The method of claim 14 further comprising using said one or more layers of interconnect metal for interconnections between one or more points of electrical contact on each of said semiconductor dies.

* * * * *